(12) United States Patent
Wu

(10) Patent No.: US 10,014,405 B1
(45) Date of Patent: Jul. 3, 2018

(54) SEMICONDUCTOR DEVICE WITH EXTENDED ELECTRICALLY-SAFE OPERATING AREA

(71) Applicant: TEXAS INSTRUMENTS INCORPORATED, Dallas, TX (US)

(72) Inventor: Xiaoju Wu, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/596,925

(22) Filed: May 16, 2017

Related U.S. Application Data

(60) Provisional application No. 62/441,018, filed on Dec. 30, 2016.

(51) Int. Cl.
| | | |
|---|---|---|
| H01L 29/78 | (2006.01) | |
| H01L 29/08 | (2006.01) | |
| H01L 29/49 | (2006.01) | |
| H01L 29/66 | (2006.01) | |
| H01L 21/266 | (2006.01) | |

(52) U.S. Cl.
CPC ........ *H01L 29/7811* (2013.01); *H01L 21/266* (2013.01); *H01L 29/086* (2013.01); *H01L 29/0878* (2013.01); *H01L 29/4916* (2013.01); *H01L 29/66727* (2013.01)

(58) Field of Classification Search
CPC .............. H01L 29/7811; H01L 21/266; H01L 29/66727; H01L 29/0878; H01L 29/086; H01L 29/4916
See application file for complete search history.

(56) References Cited

U.S. PATENT DOCUMENTS

| | | | | |
|---|---|---|---|---|
| 2014/0197422 A1* | 7/2014 | Wada | ................... | H01L 29/872 257/77 |
| 2017/0301788 A1* | 10/2017 | Fukui | ................. | H01L 29/7811 |

* cited by examiner

*Primary Examiner* — Selim Ahmed
(74) *Attorney, Agent, or Firm* — Jacqueline J. Garner; Charles A. Brill; Frank D. Cimino

(57) ABSTRACT

In at least some embodiments, a semiconductor device comprises a source region is formed within a well. The source region comprises a first dopant type, and the well comprises a second dopant type opposite the first dopant type. A termination region is formed within the well, the termination region being aligned with the source region and having an end adjacent to and spaced apart from an end of the source region. The termination region comprises a semiconducting material having the second dopant type. A preselected concentration value of the dopant in the termination region is greater than a concentration value of the second dopant type in the well.

15 Claims, 8 Drawing Sheets

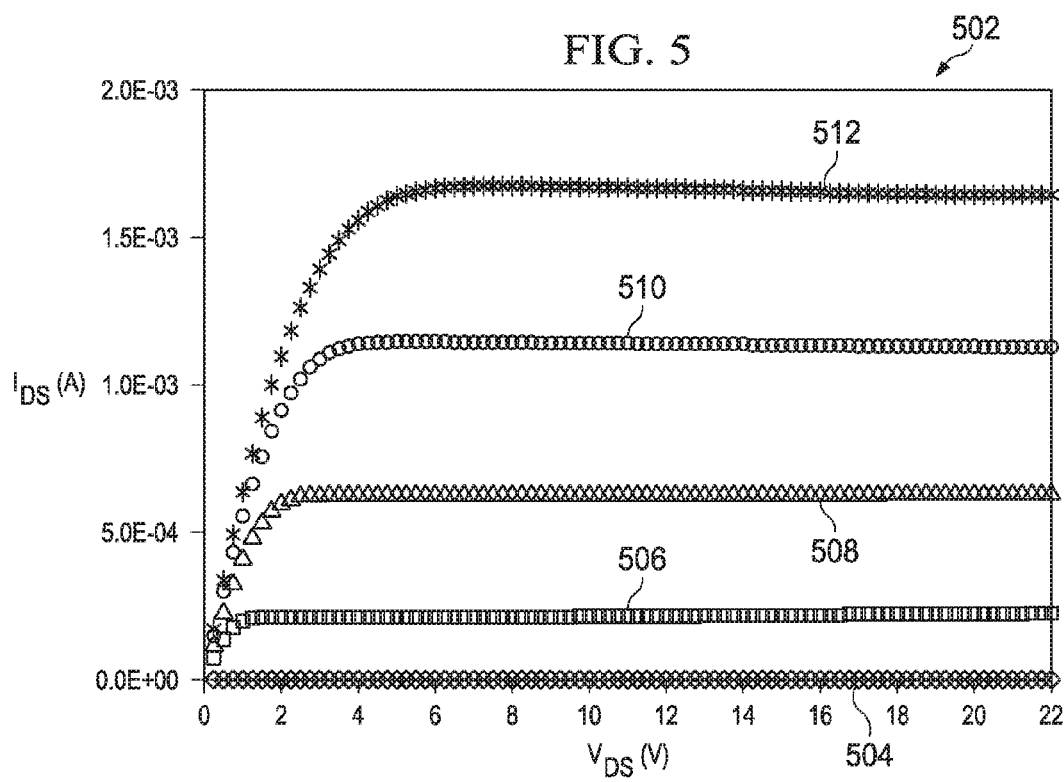
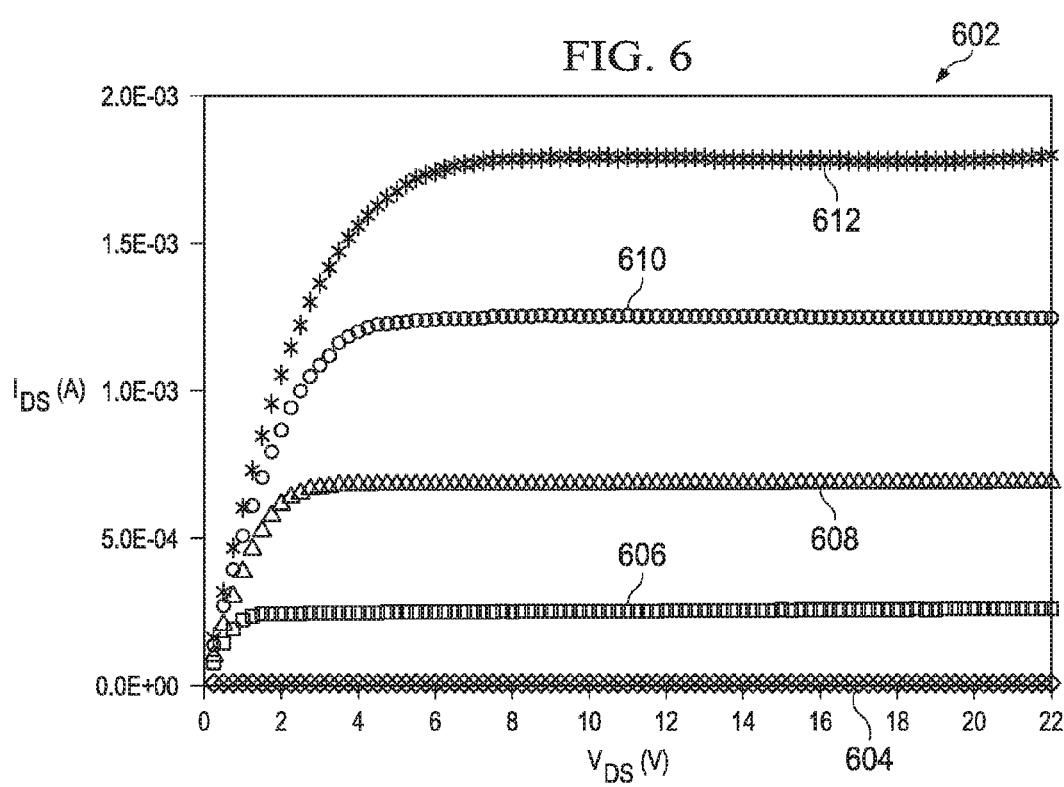

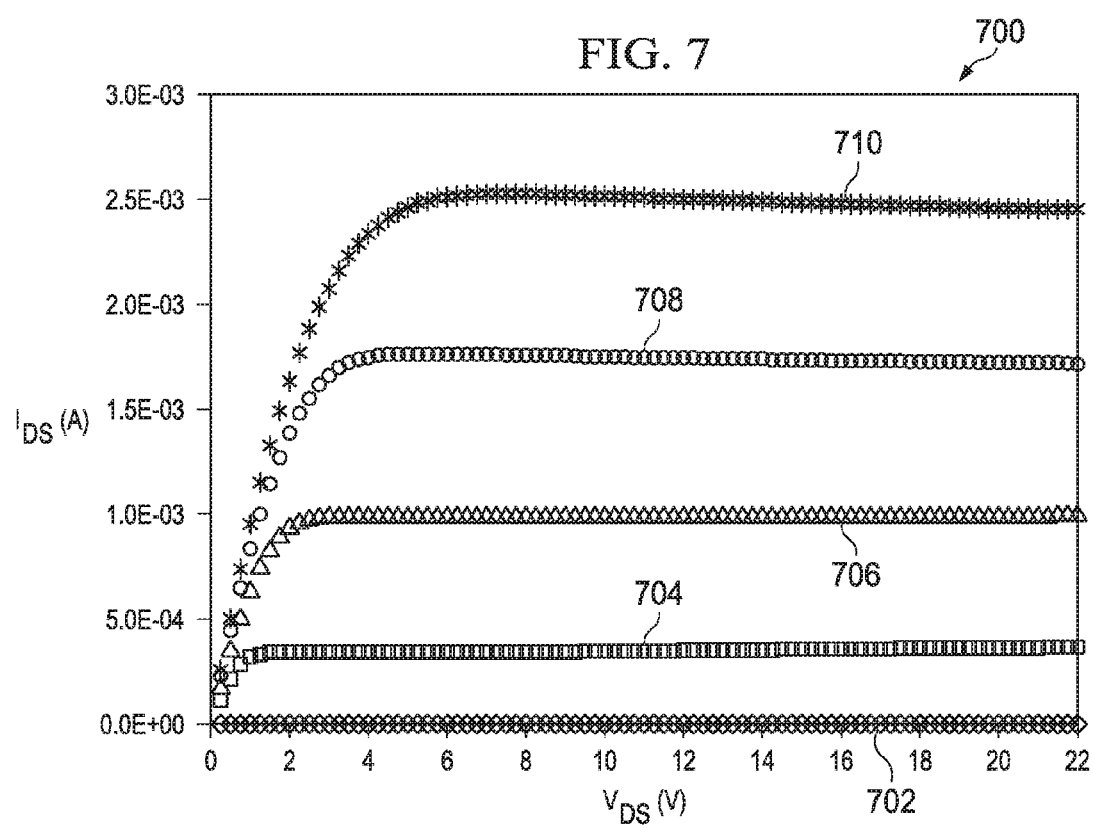

US 10,014,405 B1

SEMICONDUCTOR DEVICE WITH EXTENDED ELECTRICALLY-SAFE OPERATING AREA

CROSS-REFERENCE TO RELATED APPLICATIONS

The present application claims priority to U.S. Provisional Patent Application No. 62/441,018, which was filed 30 Dec. 2016, is titled "Semiconductor Device with Extended Electrically-Safe Operating Area," and is hereby incorporated herein by reference in its entirety.

BACKGROUND

High-voltage metal oxide semiconductor field effect transistors (MOSFETs) often exhibit electrically safe operating area (ESOA) limitations and unsatisfactory drain-source conductance characteristics, particularly in applications where the gate-source voltage ($V_{GS}$) and the drain-source voltage ($V_{DS}$) are simultaneously high. These effects become more severe as the sizes of devices shrink, limiting the scaling of devices to smaller process nodes.

SUMMARY

In at least some embodiments, a semiconductor device comprises a source region is formed within a well. The source region comprises a first dopant type, and the well comprises a second dopant type opposite the first dopant type. A termination region is formed within the well, the termination region being aligned with the source region and having an end adjacent to and spaced apart from an end of the source region. The termination region comprises a semiconducting material having the second dopant type. A preselected concentration value of the dopant in the termination region is greater than a concentration value of the second dopant type in the well.

At least some embodiments are directed to a method comprising forming a source region in a well. The source region comprises a semiconducting material having a first dopant type, and the well comprises a semiconducting material having a second dopant type opposite the first dopant type. The method also comprises implanting dopants having the second dopant type in a termination region in the well adjacent to the source region. A concentration of the dopant of the second dopant type in the termination region and a concentration of the dopant of the first dopant type in the source region are substantially the same.

At least some embodiments are directed to a semiconductor device comprising a source region formed within a well, with the source region comprising a first dopant type, and the well comprising a second dopant type opposite the first dopant type. The device also comprises a drain region comprising a first semiconducting material having the first dopant type positioned in a spaced-apart relationship with the source region. The device further comprises a drift region comprising a second semiconducting material having the first dopant type, with the drift region positioned about the drain region. The drift region is positioned in a spaced-apart relationship with the source region. A concentration of the first dopant type in the drift region has a preselected value less than another preselected value of a concentration of the first dopant type in the drain region. A portion of the well between the source region and the drift region comprises a channel region. A polysilicon gate is positioned above the drift region and channel region, where the polysilicon gate comprises a lateral extension overlying a portion of the well, and where the lateral extension extends longitudinally from an end of an end-cap portion of the polysilicon gate to an end of the source region.

BRIEF DESCRIPTION OF THE DRAWINGS

For a detailed description of various embodiments, reference will now be made to the accompanying drawings, in which:

FIG. 5 shows a graph of drain-source characteristics of a MOSFET device in accordance with various embodiments.

FIG. 6 shows a graph of drain-source characteristics of a MOSFET device in accordance with various embodiments.

FIG. 7 shows a graph of drain-source characteristics of a MOSFET device in accordance with various embodiments.

DETAILED DESCRIPTION

In the following discussion and in the claims, the term "based on" means "based at least in part on." The term "about," as used herein in conjunction with a numerical value, shall mean the recited numerical value, accounting for generally accepted variation in measurement, manufacture, and the like in the relevant industry. The term "substantially the same" means that the two values or components are either identical or are within generally accepted manufacturing tolerances of each other.

Based on the ESOA limitations described above, there is a need in the art for semiconductor devices that have an extended ESOA to operate over the full range of $V_{GS}$ and $V_{DS}$ without degraded drain-source conductance characteristics. Accordingly, embodiments of scalable, high-voltage (HV) metal-oxide semiconductor field effect transistor (MOSFET) devices with extended electrically-safe operating areas (ESOA) are described. Embodiments of the MOSFET may include poly gate extensions and termination regions aligned with and adjacent to source regions. The poly gate extensions serve as a mask for the implantations of the source and termination regions. The termination regions reduce the electric fields and consequently suppress impact ionization that is at least partially responsible for degraded drain-source conductivity characteristics in existing HV MOSFETS. In another embodiment, lateral extensions of the poly gate are positioned from the end cap region of the poly gate to near the ends of the source regions of the MOSFET. The lateral extensions of the poly gate serve to reduce electric fields in the end cap region to suppress impact ionization. As a consequence, the disclosed MOSFET has an extended ESOA and can operate with both a high drain-source voltage and a high gate-source voltage. Safe operation at both high gate-source and high drain-source voltages is advantageous in various applications, such as a switched-mode DC-DC converter with a high-side switch.

Figure 1:
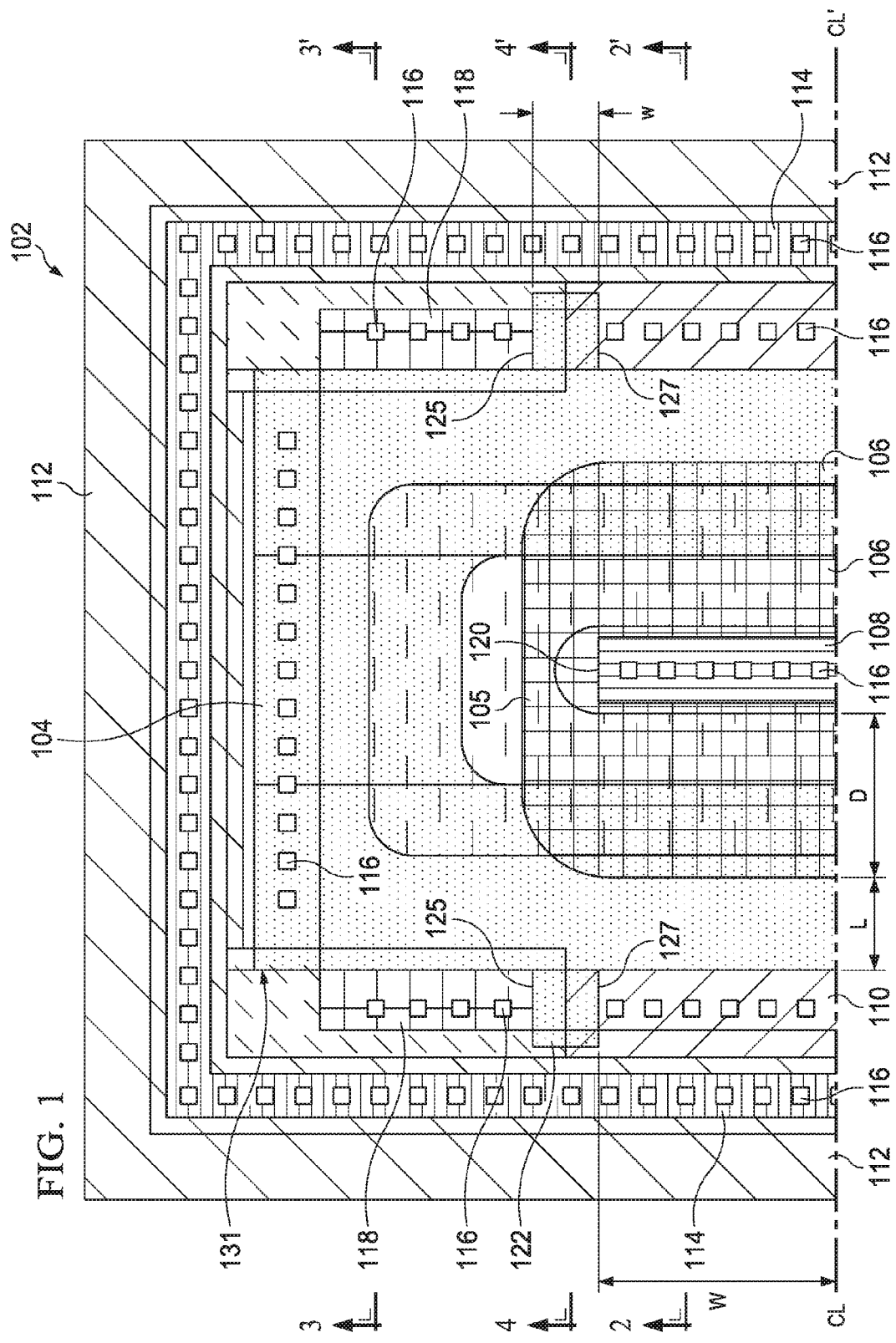
FIG. 1 shows a plan view of a layout of a MOSFET device in accordance with various embodiments.

FIG. 1 shows a plan view of a MOSFET device 102 layout in accordance with embodiments. For ease of illustration, only one-half of the device 102 is shown, with the remaining half being substantially symmetrically positioned about the line CL-CL'. To provide a frame of reference for the description to follow, the orientation of the line CL-CL' will be taken to define a "transverse" orientation and the orientation perpendicular to the line CL-CL' will be taken to define a "longitudinal" orientation. The planform of MOSFET device 102 may be referred to as a "racetrack" shape with the structural features of the device generally having dimensions greater in the longitudinal orientation than the transverse orientation (i.e., generally rectangular with rounded corners). However, in at least some embodiments, some of the dimensions of the structural features may be substantially the same in both the longitudinal and transverse orientations whereby the planform would be more circular than "racetrack" in shape. These geometric descriptions are illustrative and non-limiting.

Figure 2:
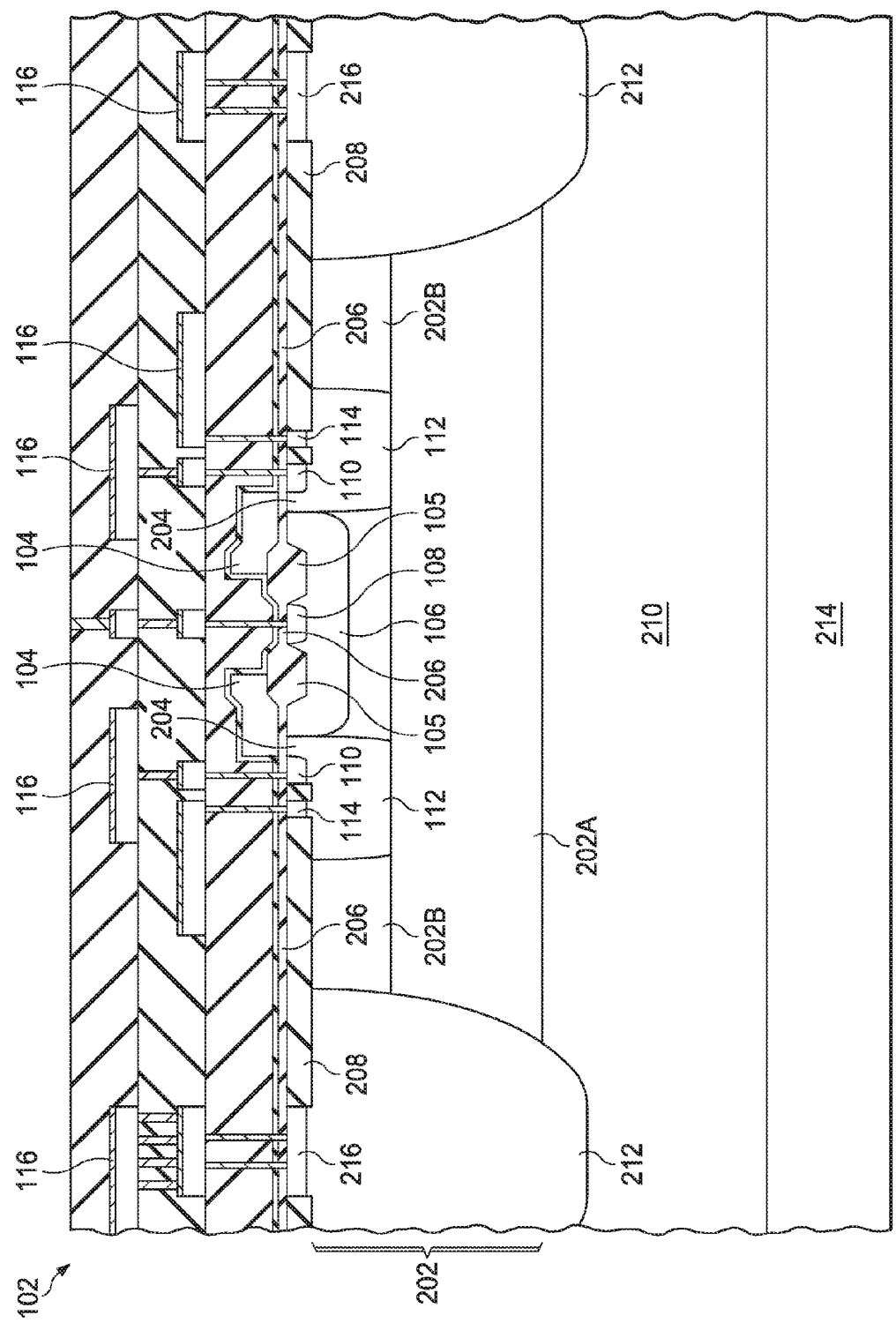
FIG. 2 shows a cross-sectional view of a MOSFET device in accordance with various embodiments.

The MOSFET device 102 may include a polysilicon layer 104 (hereinafter referred to as poly gate 104), which forms the gate of device 102. In some embodiments, the poly gate 104 overlies a portion of a drift region 106 and a channel (depicted as the channel region 204 in FIG. 2; not visible in FIG. 1). A portion of poly gate 104 comprises an end cap region 131. End cap region 131 is discussed further below. The drift region 106 may be positioned about a drain region 108 (as FIG. 2 depicts). Further, the drift region 106 may be positioned between the drain region 108 and source regions 110 of device 102. Drift region 106 may be an n-type region having a dopant concentration less than the drain region 108. The source regions 110 and the drain region 108 may comprise a doped semiconducting material (e.g., silicon) having a first dopant type, which may be an n-type (or donor) dopant or a p-type (or acceptor) dopant. In some embodiments, the device 102 is an NMOS device in which the drain region 108 and the source regions 110 comprise highly-doped n-type regions. Dopant concentrations of either type, depending on the device type (NMOS or PMOS) in the source regions 110 and drain region 108 may be greater than about $1\times10^{19}$ per cubic centimeter (cc), in at least some embodiments. The drain region 108 may be formed by implanting an n-type impurity—such as arsenic or phosphorus—into the drift region 106, which itself may be a lightly-doped n-type region, as depicted in the cross-sectional view of FIG. 2.

Figure 3:
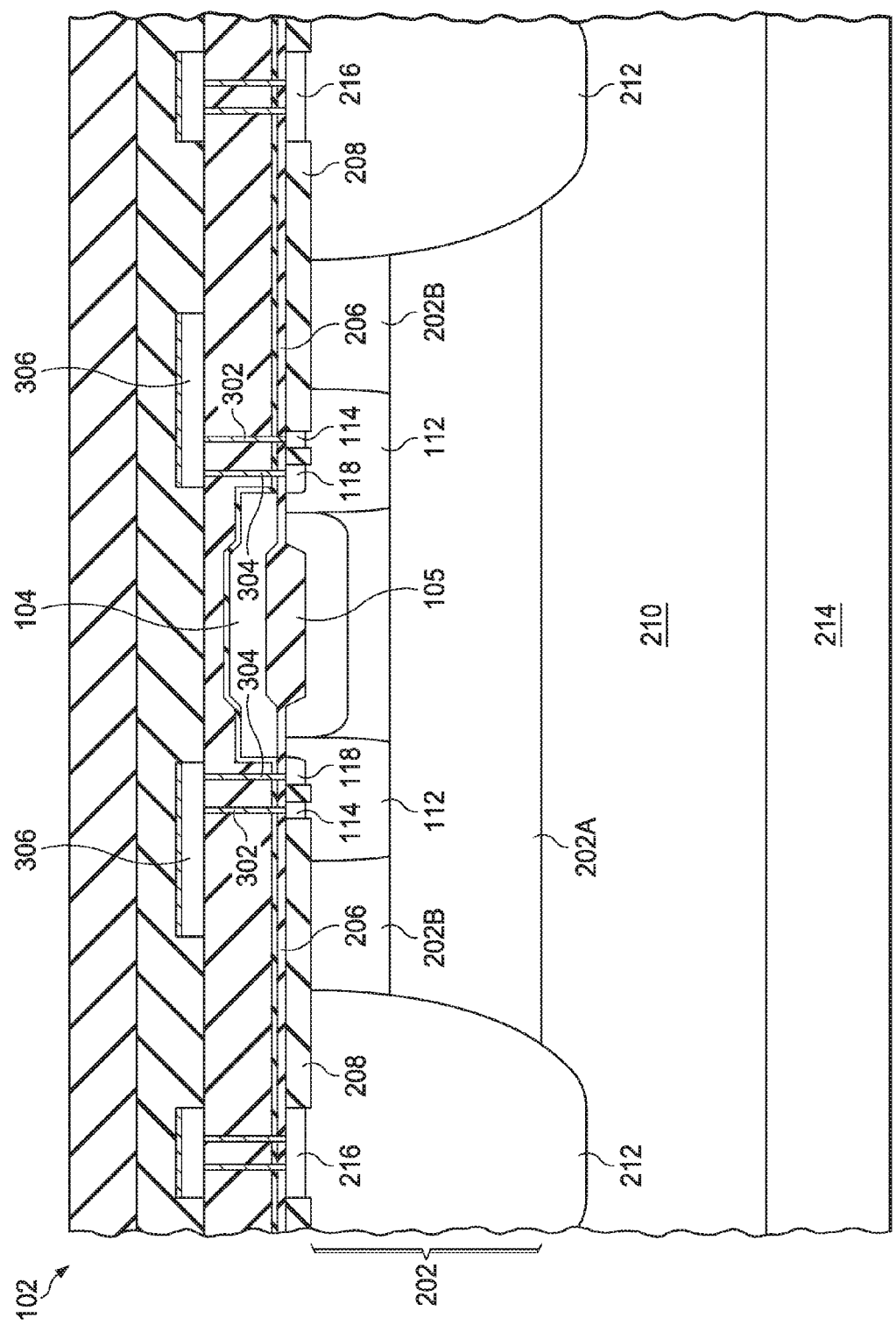
FIG. 3 shows a cross-sectional view of a MOSFET device in accordance with various embodiments.
Figure 4:
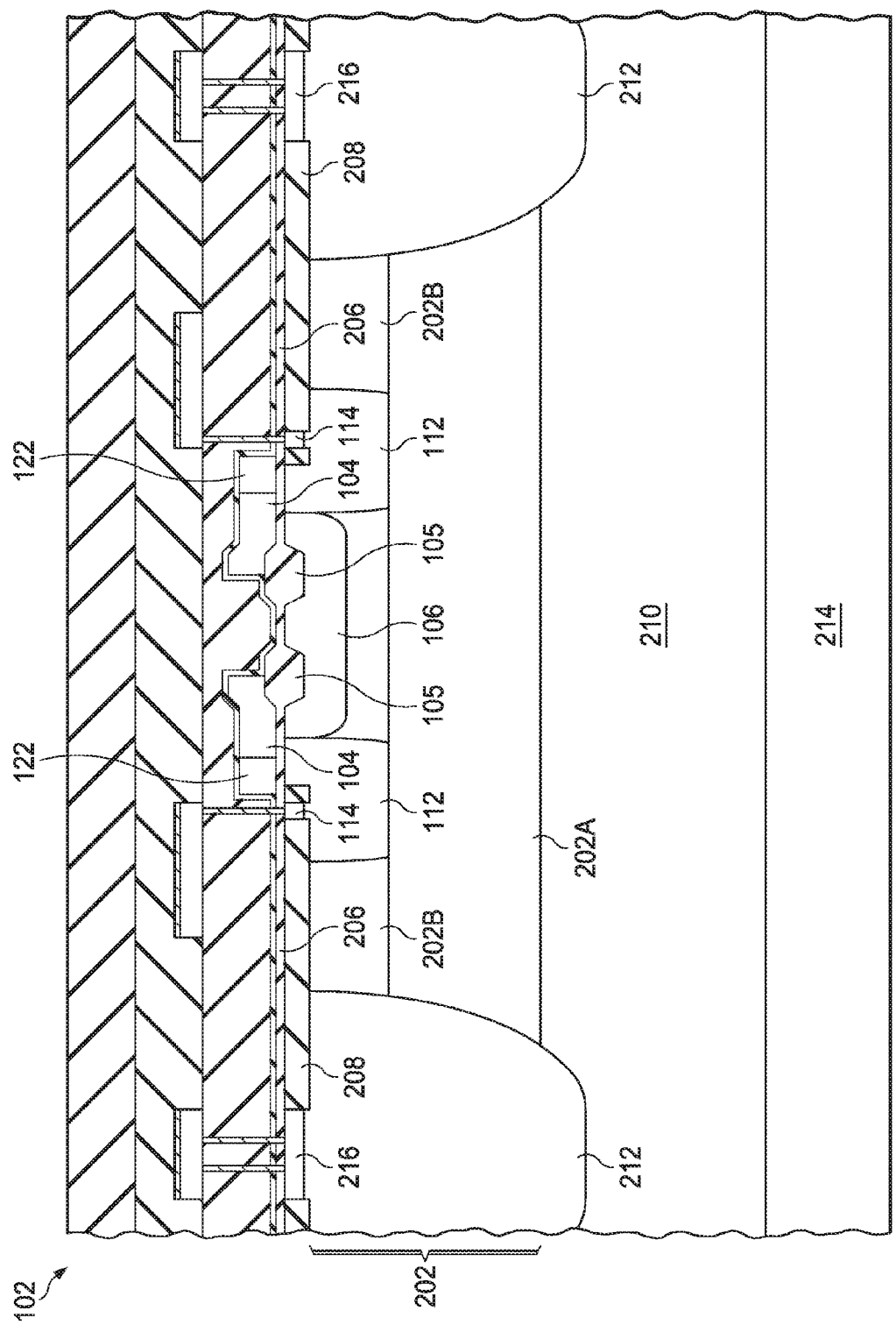
FIG. 4 shows a cross-sectional view of a MOSFET device in accordance with various embodiments.

In some embodiments, the drift region 106 may comprise a non-uniform n-type dopant dose formed by a plurality of implants. Examples of such implants include a low-energy implant in the energy range of about 10-60 kiloelectron-volts (Kev) at a dopant dose in the range of about $1-5\times10^{12}$ per square centimeter ($1-5\times10^{12}/cm^2$), a medium-energy implant in the energy range of about 80-150 Kev at a dopant dose in the range of about $1-5\times10^{12}/cm^2$, and a high-energy implant in the energy range of about 200-300 Kev at a dopant dose of about $1-5\times10^{12}/cm^2$. The dopant concentration in the drift region, in some embodiments, may be in the rage of about $5\times10^{15}$ per cc and about $1\times10^{17}$ per cc. The implant energy controls the depth of the implant, thereby providing a vertical dopant concentration gradient. In at least some embodiments, the concentration of the n-type dopant in the drain region 108 is greater than about $1\times10^{19}/cc$. Similarly, the source regions 110 may be highly-doped n-type regions with an n-type dopant concentration of greater than about $1\times10^{19}/cc$ as set forth above. However, the source regions 110 may be implanted into a shallow well (SW) 112 (only a portion of which is visible in FIG. 1), which may be a highly-doped p-type region in an NMOS device. In at least some embodiments, the dopant concentration may be in the range of about $5\times10^{16}/cc$ to about $1\times10^{18}/cc$. As FIGS. 2-4 depict, the source regions 110, the drift region 106, and the drain region 108 may be spaced apart from each other. Further, the spaced-apart relationship between source regions 110 and drift region 106 defines a channel region within the SW 112 (depicted as the channel region 204 in FIG. 2; not visible in FIG. 1).

A local oxidation of silicon (LOCOS) region 105 may be positioned between the drift region 106 and the poly gate 104, and it may be adjacent to a gate oxide (labeled as 206 in FIG. 2; not shown in FIG. 1) as described in conjunction with FIG. 2 below. Alternatively, in some embodiments, a shallow trench isolation (STI) may be used rather than a LOCOS region 105. In such embodiments, the STI may comprise a silicon dioxide ($SiO_2$) region similar to that portion of the LOCOS region 105 at and below the level of the gate oxide 206. In at least some embodiments, the drain region 108 has a half-width W in the range from about 0.4 micrometers (microns) to about 2 microns. The length L of the channel region (not visible in FIG. 1) extends transversely from the respective edges of each of source regions 110 to the LOCOS region 105 (or to the STI in alternative embodiments), and, in some embodiments may be about 1.2 microns. In other embodiments, the channel length L may be in the range of about 0.5 microns to about 2 microns. The transverse width D of drift region 106 may be between about 0.5 microns and about 2 microns. These values are merely illustrative and do not limit the scope of this disclosure.

Positioned above and abutting the SW 112 is a back gate region 114 which, in some embodiments, is a highly-doped p-type region. The relationship between the SW 112, the source regions 110, and the back gate region 114 may be seen in the cross-sectional view of FIG. 2, described below. The relationship between the SW 112 and the back gate region 114 may be seen in FIGS. 2, 3, and 4. Contacts 116 provide electrical connections to the drain region 108, the source regions 110, and the back gate region 114 whereby these regions may be coupled to external circuitry (not shown in FIG. 1).

Termination regions 118 may be formed within the SW 112. The termination regions 118 may be aligned with and adjacent to the source regions 110 and, in at least some embodiments, the termination regions 118 are longitudinally positioned beginning just beyond an end 120 of drain region 108. In embodiments in which the source regions 110 are n-type regions, the termination regions 118 may comprise highly-doped p-type material. Ends 125 of termination regions 118 are adjacent to respective ends 127 of source regions 110 and are in a spaced-apart relationship with ends 127. In at least some embodiments, the poly gate 104 may include multiple lateral extensions 122, each of which is a fin- or tab-like region that overlays at least a portion of the SW 112 and which defines a boundary region between the source regions 110 and the termination regions 118. Each lateral extension 122 serves as a mask during implantation of the n-type and p-type dopants (such as boron) that respectively form the source regions 110 and the termination regions 118. Thus, in some embodiments, the lateral extensions 122 define self-aligned structures for the source regions 110 and termination regions 118 with the spaced-apart relationship of the ends 125 and 127 defined by a longitudinal width of the lateral extensions 122. In at least some embodiments, the lateral extension 122 may have a longitudinal width ω in the range of about 0.1 micron to about 1 micron, inclusive.

FIG. 2 depicts a cross-sectional view of device 102 cut along the plane denoted by the line 2-2' in FIG. 1. As depicted in FIG. 2, the device 102 may comprise an epitaxial layer (EPI) 202 that includes a buried p-layer portion (PBL) 202A and a more lightly-doped EPI region 202B. The SW 112 may be implanted within the EPI region 202B. The PBL 202A may have a dose and vertical position chosen to mitigate against breakdown and vertical punch through between drain region 108 and n-type buried layer (NBL) 210. In at least some embodiments, a PBL 202A may have a dopant dose from about $2\times10^{12}/cm^2$ to about $5\times10^{12}/cm^2$. Dopant concentrations in EPI region 202B may be in a range from about $5\times10^{14}/cc$ to about $5\times10^{15}/cc$.

A portion of the SW 112 comprises a channel region 204 between the source regions 110 and the drift region 106. As described in conjunction with FIG. 1, the drift region 106 is positioned about the drain region 108 and may comprise an n-type region in an NMOS device. The drift region 106 may be much more lightly doped than the drain region 108. The LOCOS region 105 may be positioned between the poly gate 104 and the drift region 106, and it may abut the gate oxide 206. The gate oxide 206 may be positioned between the poly gate 104 and the channel regions 204.

As FIG. 2 depicts, the back gate region 114 is positioned above and in contact with the SW 112. A shallow trench isolation (STI) 208 may be positioned above the EPI region 202B, above the SW 112, and between the back gate region 114 and the source region 110. In some embodiments, the STI 208 comprises a dielectric material, such as silicon dioxide.

In some embodiments, the PBL 202A is laid down on an n-type buried layer (NBL) 210. The device 102 may include several structural elements including the NBL 210 and deep n-wells 212 that serve to isolate the active region and the back gate region of the device. Highly doped regions 216, which are n-type in an NMOS device, provide a tie between deep n-wells 212 and contacts 116. The device 102 may comprise n-type impurities implanted into and through the PBL 202A and the EPI region 202B and into the NBL 210. This isolation serves, for example, to mitigate against noise propagation through the substrate 214. Further, in an isolated device, the back gate region 114 may be externally tied to the source regions 110. The contacts 116 provide for the coupling of various structures—e.g., the source regions 110, the drain region 108, and the back gate region 114—to external circuitry (not shown in FIG. 2). The scope of this disclosure is not limited to isolated devices. Non-isolated devices are also contemplated. While such non-isolated devices may omit the NBL 210 and the deep n-wells 212, the source regions 110, the drain region 108, the termination regions 118 (FIG. 1), and the drift region 106 would remain.

FIG. 3 depicts a cross-sectional view of the device 102 cut along the plane denoted by the line 3-3' in FIG. 1. In FIG. 3, the substrate 214, the NBL 210, the EPI layer 202 (which includes the PBL 202A and the EPI region 202B), the SW 112, the LOCOS region 105, the deep N-wells 212, the gate oxide 206, and the STI 208 are as described in conjunction with FIGS. 1 and 2. In FIG. 3, the termination region 118 is formed within the SW 112. The termination region 118 may comprise a highly-doped p-type region. A p-type implant in the termination region 118 in an NMOS device inhibits current flow in the end cap region 131 (FIG. 1), thus mitigating impact ionization. Further, in this example, the termination region 118 may be tied to the back gate region 114 through vias 302 and 304 and silicide layer 306.

FIG. 4 shows a cross-sectional view of the device 102 cut along the plane denoted by the line 4-4' in FIG. 1. The "cut" passes through lateral extensions 122 of the poly gate 104. In FIG. 4, the substrate 214, the NBL 210, the EPI layer 202, the SW 112, the LOCOS region 105, the drift region 106, the deep N-wells 212, the gate oxide 206, and the STI 208 are as described in conjunction with FIGS. 1 and 2. The lateral extensions 122 are positioned over the gate oxide 206 and a portion of the SW 112 that would otherwise comprise the source regions 110. During implantation of the source regions 110, the lateral extensions 122 serve as masks for the self-aligned implantation of the source regions 110 (not shown in FIG. 4) and the termination regions 118 (not shown in FIG. 4), as previously described. In this way, the current flow under the lateral extensions is reduced by the masking of the implant of the highly-doped source regions 110.

FIGS. 5-7 show drain-source characteristic curves for several examples of devices embodying features in accordance with the principles of this disclosure. FIG. 5 depicts a panel 502 of drain current $I_{DS}$ (in amperes) versus drain-source voltage $V_{DS}$ (in volts) for one illustrative device. In this example, the device may have a half-width of the drain W of 1 micron. For certain voltages, small structure sizes correspond to higher internal electric fields. The curves 504, 506, 508, 510 and 512 correspond to $V_{GS}$ values of 1 volt, 2 volts, 3 volts, 4 volts, and 5 volts, respectively.

FIG. 6 illustrates the scaling of the drain region of the device to smaller dimensions. Panel 602 shows the drain-source characteristics of a device having a drain region half-width W of 0.9 microns. Curves 604, 606, 608, 610 and 612 correspond to $V_{GS}$ of 1 volt, 2 volts, 3 volts, 4 volts, and 5 volts, respectively. Notwithstanding the scaling to small sizes, the drain-source characteristics for the device represented in panel 602 exhibit no anomalous drain-source conductivity behavior.

FIG. 7 illustrates the drain-source characteristics of an embodiment scaled to a smaller drift region, in accordance with principles disclosed herein. Panel 700 shows curves 702, 704, 706, 708, and 710. The curves 702, 704, 706, 708, and 710 depict the drain current $I_{DS}$ versus drain-source voltage $V_{DS}$ for gate-source voltages $V_{GS}$ of 1 volt, 2 volts, 3 volts, 4 volts, and 5 volts, respectively. No anomalous behavior of the drain-source conductivity is seen over the entire range of gate-source and drain-source voltages.

Figure 8:
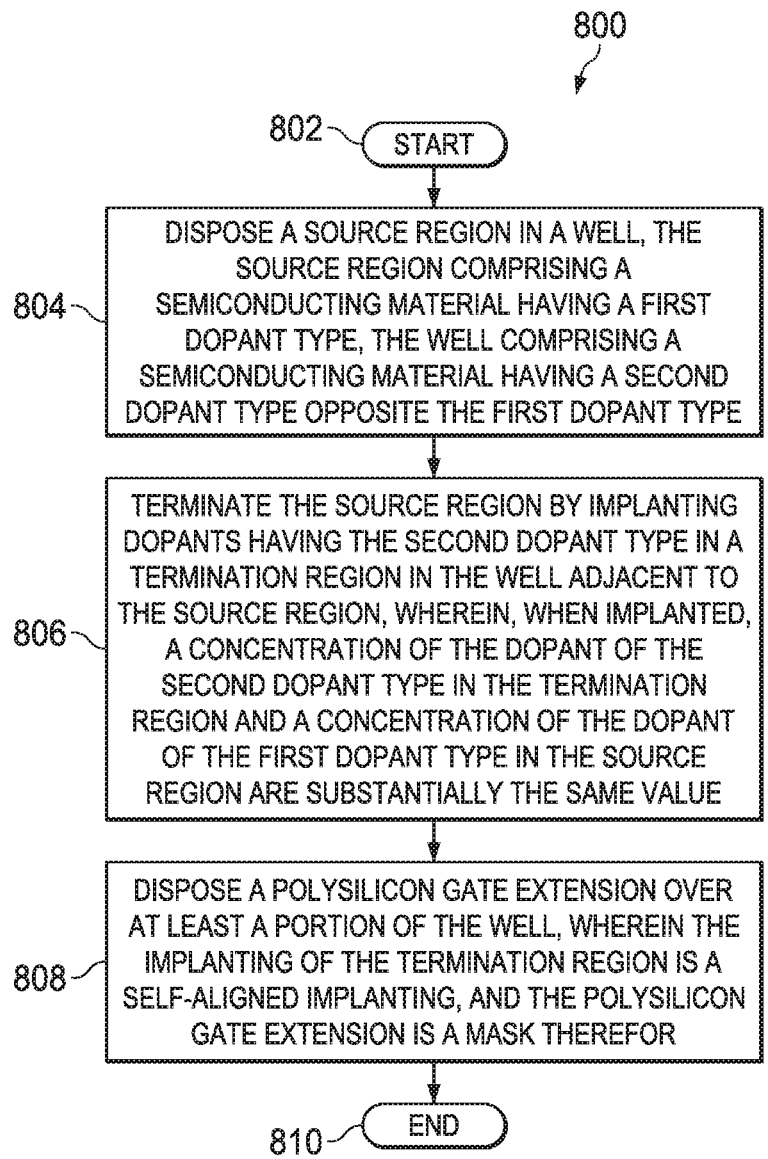
FIG. 8 shows a flowchart of a method in accordance with various embodiments.

FIG. 8 shows a flowchart of a method 800. Method 800 starts at block 802. In block 804, a source region is formed in a well. The source region comprises a semiconducting material (e.g., silicon) having a first dopant type. The well comprises a semiconducting material having a second dopant type that is opposite the first dopant type. For example, as described above, in an NMOS device, the first dopant type is an n-type dopant and the second dopant type is a p-type dopant. In block 806, the source region is terminated by implanting dopants having the second dopant type in a termination region in the well adjacent to the source region. When implanted, a concentration of the dopant of the second type in the termination region and a concentration of the dopant of the first type in the source region are substantially the same value. Stated another way, the dopant concentrations in the source region and the termination region are substantially the same, albeit of opposite type. In block 808, a polysilicon gate extension is positioned over at least a portion of the well. The implantation of the termination region is self-aligned, and the polysilicon gate extension provides the mask for the implantation. Further, disposing the source region in the well may also comprise implanting a dopant having the first dopant type in the well. The implantation may be self-aligned, with the polysilicon gate extension providing the mask for the implantation. Method 800 ends at block 810.

Figure 9:
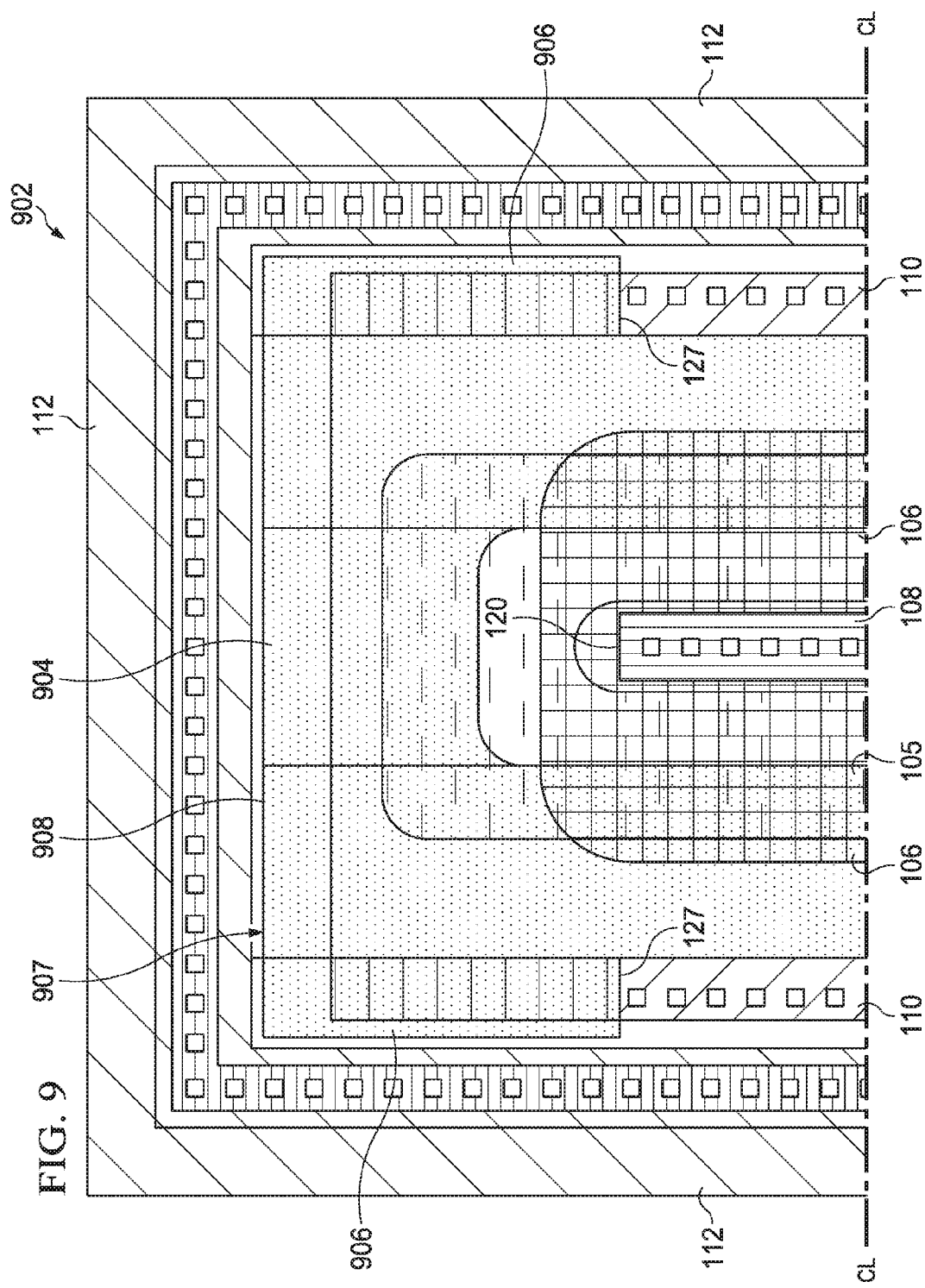
FIG. 9 shows a plan view of a layout of a MOSFET device in accordance with various embodiments.

FIG. 9 shows a MOSFET device 902 in accordance with another embodiment. Device 902 includes a drain region 108 and source regions 110, similar to device 102 in FIG. 1. Likewise, device 902 includes a LOCOS 105 and drift region 106. A poly gate 904 overlies a portion of drift region 106 and a channel (not visible in FIG. 9) is positioned between drift region 106 and sources 110 as previously described in conjunction with FIGS. 1 and 2. In device 902, poly gate 904 includes lateral extensions 906 that, in at least some embodiments, may extend longitudinally from an end 908 of end cap region 907 of poly gate 904 to ends 127 of the source regions 110. In device 902, lateral extensions 906 may serve as a mask during implantation of highly doped source regions 110, which in an NMOS embodiment comprise n-type dopants. A cross-section through device 902 at any position that includes lateral extension 906 would appear as in FIG. 4, which shows a cross-section through device 102 at the position of lateral extension 122 (FIGS. 1 and 4). Thus, the lateral extensions 106 may overlay a portion of a shallow well 112 (FIGS. 1 and 4) with a gate oxide 206 (FIG. 4) therebetween as exemplified by device 102 (FIGS. 1 and 4).

The above discussion is meant to be illustrative. Numerous variations and modifications will become apparent to those skilled in the art once the above disclosure is fully appreciated. It is intended that the following claims be interpreted to embrace all such variations and modifications.

What is claimed is:

1. A semiconductor device comprising:
a source region formed within a well, the source region comprising a first dopant type, and the well comprising a second dopant type opposite the first dopant type; and
a termination region formed within the well, the termination region aligned with the source region and having an end adjacent to and spaced apart from an end of the source region, the termination region comprising a semiconducting material having the second dopant type with a preselected concentration value greater than a concentration value of the second dopant type in the well.

2. The semiconductor device of claim 1 wherein the first dopant type is an n-type dopant.

3. The semiconductor device of claim 2 wherein a concentration value of the first dopant type in the source region is greater than about $1\times10^{19}$ per cubic centimeter (cc).

4. The semiconductor device of claim 1 wherein the second dopant type in the termination region is a p-type dopant.

5. The semiconductor device of claim 4 wherein the preselected concentration value of the second dopant type in the termination region is greater than about $1\times10^{19}$ per cubic centimeter (cc).

6. The semiconductor device of claim 1 further comprising:
a drain region comprising a second semiconducting material having the first dopant type positioned in a spaced-apart relationship with the source region;
a drift region comprising a third semiconducting material having the first dopant type, the drift region positioned about the drain region, wherein:
the drift region is positioned in another spaced-apart relationship with the source region;
a concentration of the first dopant type in the drift region has a preselected value less than a preselected value of the concentration of the first dopant type in the drain region; and
a portion of the well between the source region and the drift region comprises a channel region; and
a polysilicon gate positioned above the drift region and channel region, wherein the polysilicon gate comprises a lateral extension overlying a portion of the well.

7. The semiconductor device of claim 6 wherein the lateral extension has a preselected longitudinal width, the longitudinal width defining the spaced-apart relationship between the end of the termination region adjacent to the source region and the end of the source region.

8. The semiconductor device of claim 7 wherein the preselected longitudinal width of the lateral extension is between about 0.1 micrometer (micron) and about 1.0 micron, inclusive.

9. The semiconductor device of claim 7 wherein the lateral extension defines a self-aligned structure for the source and the termination regions.

10. The semiconductor device of claim 6 wherein the preselected value of the concentration of the first dopant type in the drift region is between about $5\times10^{15}$ per cubic centimeter (cc) and about $1\times10^{17}$ per cc.

11. The semiconductor device of claim of claim 1 further comprising a back gate region wherein:
the back gate region comprises the second dopant type having a concentration greater than the concentration value of the second dopant type in the well; and
the back gate region is in electrical contact with the well.

12. The semiconductor device of claim 11 wherein the back gate region is electrically coupled to the termination region.

13. A semiconductor device comprising:
a source region formed within a well, the source region comprising a first dopant type, and the well comprising a second dopant type opposite the first dopant type;
a drain region comprising a first semiconducting material having the first dopant type positioned in a spaced-apart relationship with the source region;
a drift region comprising a second semiconducting material having the first dopant type, the drift region positioned about the drain region, wherein:
the drift region is positioned in a spaced-apart relationship with the source region;
a concentration of the first dopant type in the drift region has a preselected value less than another preselected value of a concentration of the first dopant type in the drain region; and
a portion of the well between the source region and the drift region comprises a channel region; and
a polysilicon gate positioned above the drift region and channel region, wherein the polysilicon gate comprises a lateral extension overlying a portion of the well, wherein the lateral extension extends longitudinally from an end of an end-cap portion of the polysilicon gate to an end of the source region.

14. The semiconductor device of claim 13 wherein:
the first dopant type is an n-type dopant; and
a concentration of the first dopant type in the source region is greater than about $1\times10^{19}$ per cubic centimeter (cc).

15. The semiconductor device of claim 14 wherein a concentration of the second dopant type in the well is in the range of about $5\times10^{16}$/cc to about $1\times10^{18}$/cc.

* * * * *